(12) United States Patent
Sugiura et al.

(10) Patent No.: US 9,506,138 B2
(45) Date of Patent: Nov. 29, 2016

(54) PISTON RING

(71) Applicant: NIPPON PISTON RING CO., LTD., Saitama-shi, Saitama (JP)

(72) Inventors: Hiroyuki Sugiura, Saitama (JP); Atsushi Chiba, Saitama (JP); Makoto Kajiwara, Saitama (JP); Kazuhiro Fujimura, Saitama (JP); Katsuaki Ogawa, Saitama (JP); Kazuhiro Sameshima, Saitama (JP)

(73) Assignee: Nippon Piston Ring Co., Ltd., Saitama-shi (JP)

(*) Notice: Subject to any disclaimer, the term of this patent is extended or adjusted under 35 U.S.C. 154(b) by 0 days.

(21) Appl. No.: 14/694,581

(22) Filed: Apr. 23, 2015

(65) Prior Publication Data

US 2015/0225836 A1 Aug. 13, 2015

Related U.S. Application Data

(63) Continuation of application No. 13/985,733, filed as application No. PCT/JP2012/054831 on Feb. 27, 2012, now abandoned.

(30) Foreign Application Priority Data

Feb. 28, 2011 (JP) .................................. 2011-041468

(51) Int. Cl.
  *B23P 15/06* (2006.01)
  *C23C 14/02* (2006.01)
  (Continued)

(52) U.S. Cl.
  CPC .............. *C23C 14/021* (2013.01); *C23C 14/16* (2013.01); *C23C 14/48* (2013.01); *F16J 9/20* (2013.01); *F16J 9/26* (2013.01); *B23P 15/06* (2013.01)

(58) Field of Classification Search
  CPC .................. Y10T 29/49274; Y10T 29/49281; Y10T 29/49282; Y10T 29/49284; B22F 5/02; F16J 9/206
  See application file for complete search history.

(56) References Cited

U.S. PATENT DOCUMENTS 3,770,286 A 11/1973 Angilella et al.
5,206,379 A 4/1993 Motoki et al.
(Continued)

FOREIGN PATENT DOCUMENTS

JP 58027860 A * 2/1983
JP S58 027860 2/1983
(Continued)

OTHER PUBLICATIONS

May 22, 2012 Search Report issued in International Application No. PCT/JP2012/054831.
(Continued)

*Primary Examiner* — Jason L Vaughan
*Assistant Examiner* — Amanda Meneghini
(74) *Attorney, Agent, or Firm* — Oliff PLC

(57) ABSTRACT

The second compression ring is formed such that the outer peripheral surface shape has a tapered face, and the radial cross-sectional shape is a rectangular ring, a scraper ring, or a Napier ring, and has a piston ring base and a hard film provided at least on an outer peripheral sliding surface thereof. The piston ring base is composed of a low-alloy steel or carbon steel having a Vickers hardness of Hv 350 Hv 550. The outer peripheral sliding surface is formed so that the axial length is from 0.01 to 0.30 mm between the outer edge end part of the tapered outer peripheral sliding surface and an imaginary line contacting with a lower end surface where a curved surface having a diameter that decreases gradually inward from the outer edge end part toward the lower end in the axial direction is parallel to a ring underside.

8 Claims, 9 Drawing Sheets

(51) Int. Cl.
*F16J 9/20* (2006.01)
*F16J 9/26* (2006.01)
*C23C 14/16* (2006.01)
*C23C 14/48* (2006.01)

(56) References Cited

U.S. PATENT DOCUMENTS

| | | | |
|---|---|---|---|
| 5,316,321 A | 5/1994 | Ishida et al. | |
| 5,449,547 A * | 9/1995 | Miyazaki | C23C 14/06 106/286.1 |
| 5,582,414 A * | 12/1996 | Miyazaki | C23C 14/0641 277/444 |
| 5,618,590 A * | 4/1997 | Naruse | C23C 14/0688 204/192.16 |
| 6,060,182 A * | 5/2000 | Tanaka | C23C 14/0641 277/443 |
| 6,139,022 A * | 10/2000 | Iwashita | C23C 16/26 277/442 |
| 6,149,162 A | 11/2000 | Tanaka et al. | |
| 6,485,026 B1 * | 11/2002 | Hubert | C22C 38/06 277/434 |
| 2002/0033579 A1 | 3/2002 | Ishida | |
| 2002/0175476 A1 * | 11/2002 | Chinou | F16J 9/26 277/440 |
| 2004/0012153 A1 | 1/2004 | Yoshida et al. | |
| 2004/0074445 A1 | 4/2004 | Fujii et al. | |
| 2009/0026712 A1 | 1/2009 | Kawanishi et al. | |
| 2009/0226756 A1 | 9/2009 | Ogawa et al. | |
| 2009/0278320 A1 * | 11/2009 | Araujo | C23C 14/0036 277/442 |
| 2010/0019458 A1 | 1/2010 | Esser et al. | |
| 2010/0314005 A1 | 12/2010 | Saito et al. | |

FOREIGN PATENT DOCUMENTS

| | | |
|---|---|---|
| JP | H06-293954 A | 10/1994 |
| JP | H07-150336 A | 6/1995 |
| JP | H10-252891 A | 9/1998 |
| JP | H11-189860 A | 7/1999 |
| JP | 2000170602 A | 6/2000 |
| JP | 2002-194500 A | 7/2002 |
| JP | 2002-323133 A | 11/2002 |
| JP | 2003113940 A | 4/2003 |
| JP | 2004156139 A | 6/2004 |
| JP | 2007132423 A | 5/2007 |
| JP | 2007-270880 A | 10/2007 |
| JP | 2007271072 A | 10/2007 |
| JP | 2008-163430 A | 7/2008 |
| JP | 2009235561 A | 10/2009 |
| JP | 2010-229463 A | 10/2010 |

OTHER PUBLICATIONS

Sep. 3, 2013 International Preliminary Report on Patentability issued in International Application No. PCT/JP2012/054831.
Federal Mogul. "Piston Ring Handbook (Material Specification Piston Rings GOE 64)". Oct. 1, 2001.
Hirakawa, Kimio. Japanese Standards Assocation. JIS Handbook, Steel I (Hardness Conversion Tables (Sae J 417)). Apr. 21, 1999. pp. 1154-1156.

* cited by examiner

PISTON RING

CROSS-REFERENCE TO THE RELATED APPLICATIONS

This application is a continuation application of U.S. patent application Ser. No. 13/985,733, filed Aug. 15, 2013, which is a national stage application of International Application No. PCT/JP2012/054831, filed Feb. 27, 2012, and claims the benefit of priority from Japanese Patent Application No. 2011-041468, filed Feb. 28, 2011. The prior applications, including the specifications, drawings and abstracts are incorporated herein by reference in their entirety.

FIELD OF THE INVENTION

The present invention relates to a piston ring for an internal combustion engine, and more particularly to a piston ring used as a second compression ring for an internal combustion engine.

BACKGROUND ART

In recent years, environmental issues such as global warming are gaining attention. Further fuel efficiency for an engine is also demanded in order to address a demand for reduction in $CO_2$ emission into the atmosphere. Further, due to the demand for fuel efficiency, the frictional force between a piston ring and a cylinder liner at the time of sliding is demanded to be reduced. With an increased output of an engine, the quality of a piston ring demanded is increasing, and thus, the sliding characteristics therefor are demanded (for example, wear resistance and scuffing resistance).

In view of such circumstances, a piston ring which has an excellent wear resistance and seize resistance and which maximizes the effect of reducing frictional force, a surface treatment technology and a surface modification technology for such a piston ring are being developed.

Generally, a piston for an internal combustion engine is fitted with three piston rings including a first compression ring as a compression ring, a second compression ring, and an oil ring. For the first compression ring which is exposed to a severe environment, a steel material equivalent to SUS440 (JIS (Japanese Industrial Standards) standard) which is martensite stainless steel or the like is employed. On the other hand, for the second compression ring which has light thermal load or pressure load, a stainless steel material which contains 9-14 mass % of Cr is employed.

In addition, in order to obtain a piston ring which has a good sliding characteristics as mentioned above even when the thermal load or pressure load is increased with higher output, a piston ring base is generally subjected to a nitriding treatment.

However, when at least the outer peripheral sliding surface of the piston ring base is subjected to a nitriding treatment, there have been problems that the dimensional accuracy of the piston ring base decreases and processing after the nitriding treatment becomes very difficult. There has also been drawbacks that, when a nitriding treatment process is performed, many processing processes are needed, which is costly.

The present applicants continues trial and error to resolve such problems concerning such a piston ring for an internal combustion engine and has heretofore been proposed a variety of means for solving the problems.

For example, Patent Document 1 proposes a piston ring made of a carbon steel material composed of C: 0.50 mass %, to 0.75 mass %, Si: 0.15 mass % to 0.35 mass %, Mn: 0.61 mass % to 0.95 mass %, P: 0.03 mass % or less, S: 0.03 mass % or less, the balance Fe and inevitable impurities. In Patent Document 1, the present applicant proposed that at least outside sliding surface of the second compression ring is subjected to a nitriding treatment, or to a hard chromium plating in place of the nitriding treatment.

Patent Document 2 proposes a piston ring which is made of a carbon steel material containing Cr: 9.0 mass % or more, 11.0 mass % or less and C: from 0.45 mass % to 0.55 mass %, and in which the top surface, bottom surface, outer peripheral surface and inner peripheral surface are formed of a nitriding diffusion layer having a hardness of 700 Hv (0.05) or higher in a depth of from 2 μm to 25 μm.

The piston ring proposed in Patent Document 2 is made with the second compression ring in mind. By constituting a piston ring base by a carbon steel material having the above-mentioned composition, a nitriding diffusion layer is formed in a state in which generation of a white layer is inhibited, uniformly without irregularity, thin, and all around the ring. By so doing, a grinding processing after nitriding becomes needless, which reduces cost considerably.

PRIOR ART REFERENCES

Patent Documents

Patent Document 1: Japanese Laid-Open Patent Application No. 2002-194500

Patent Document 2: Japanese Laid-Open Patent Application No. 2007-270880

SUMMARY OF THE INVENTION

The Problems Solved by the Invention

The inventions proposed in Patent Document 1 and Patent Document 2 have an advantage in that a piston ring for an internal combustion engine which has wear resistance and high strength can be produced at low cost.

The present inventors further studied to find that nitriding treatment of the piston ring base caused the above-mentioned disadvantages, and tried to form a piston ring for an internal combustion engine without performing a nitriding treatment on the piston ring base. The present inventors overcome a variety of problems appeared in the process, thereby completing the present invention.

The present invention has been made to resolve the above-mentioned problems, and an object of the present invention is to provide a piston ring for an internal combustion engine, in particular, a second compression ring, which has superior wear resistance and can be formed at low cost.

Problem Resolution Means

To solve the above-discussed problems, the piston ring according to the present invention is used as a second compression ring for an internal combustion engine, and has the outer peripheral surface shape that is tapered face and the radial cross-sectional shape that is one of a rectangular ring, a scraper ring, and a Napier ring. The piston ring has: a piston ring base; and a hard film provided at least on an outer peripheral sliding surface thereof, wherein the piston ring base is composed of a low-alloy steel or carbon steel having a Vickers hardness of Hv 350 to Hv 550, the outer peripheral sliding surface is formed in a tapered shape gradually expanding outward from the upper end of the piston ring base toward the lower end thereof, and is formed so that the axial length is from 0.01 mm to 0.30 mm between the outer edge end part of the tapered outer peripheral sliding surface and an imaginary line contacting with a lower end surface or a lower end part where a curved surface having a diameter that decreases gradually inward from the outer edge end part toward the lower end in the axial direction is parallel to a ring underside, and the hard film is composed of an ion plating coat having a film thickness of from 5 μm to 30 μm, a porosity of from 0.5% to 1.5% and a Vickers hardness of from Hv 800 to Hv 2300, the hard film being formed on the surface of the piston ring base.

By the present invention, since a second compression ring in which the outer peripheral surface shape is tapered face and in which the radial cross-sectional shape is rectangular ring, scraper ring or Napier ring does not have a conventional nitriding layer formed by a nitriding treatment, labor and cost needed for processing or heat treatment are considerably reduced. Since a hard film having the above-mentioned properties (thickness, porosity, Vickers hardness) is provided on at least the outer peripheral sliding surface of the piston ring base, the piston ring has superior wear resistance. In particular, since the Vickers hardness of a piston ring base made of a carbon steel material or low-alloy steel is in a range of from Hv 350 to Hv 550, and on such a piston ring base, a hard film having Vickers hardness of from Hv 800 to Hv 2300 is provided, there is no strength decrease which occurs during a conventional nitriding treatment process or the like and the strength is maintained, whereby a piston ring which has superior wear resistance and low cost is obtained.

In the piston ring according to the present invention, a Cr film or Cr—B film is formed as a base film of the hard film.

By the present invention, since a Cr film or Cr—B film is formed as the base film of the hard film, adherence between the piston ring base and the hard film is favorable.

In the piston ring according to the present invention, a hard carbon film is formed on the hard film.

By the present invention, since a hard carbon film is formed on the hard film, the hard carbon film functions such that the initial friction of the piston ring is reduced.

In the piston ring according to the present invention, the piston ring base has a surface that is irradiated with a metal ion which is an ionized metal target while being maintained at a temperature at which decrease in the hardness of the piston ring base does not occur is cleaned.

As mentioned above, in the present invention, the piston ring base is composed of carbon steel material or low-alloy steel having a Vickers hardness of from Hv 350 to Hv 550. Furthermore, on the piston ring base, a hard film having a Vickers hardness of from Hv 800 to Hv 2300 is formed with good adherence. Therefore, in the present invention, a cleaning treatment for forming a hard film with good adherence on a piston ring base, namely, a cleaning treatment in which a surface is irradiated with a metal ion which is an ionized metal target is performed while maintaining the temperature at which decrease in the hardness of a piston ring base does not occur. For this reason a hard film can be formed on a piston ring base whose hardness is not decreased with good adherence.

Efficacy of the Invention

By the present invention, since a second compression ring does not have a conventional nitriding layer formed by a nitriding treatment, labor and cost needed for processing or heat treatment are considerably reduced. Further, since a hard film is provided the hard film having the above-mentioned properties (thickness, porosity, Vickers hardness) on at least the outer peripheral sliding surface of the piston ring base, the piston ring has superior wear resistance. As a result, there is no strength decrease which occurs during a conventional nitriding treatment process or the like and the strength is maintained, whereby a piston ring which has superior wear resistance and low cost is obtained.

Even when such a piston ring of the present invention is used for an engine which suffers a larger thermal load or pressure load, crack in a hard film can be effectively prevented since the strength or hardness of the piston ring base is favorably maintained.

BRIEF DESCRIPTIONS OF THE DRAWINGS

EMBODIMENTS OF THE INVENTION

Figure 1A:
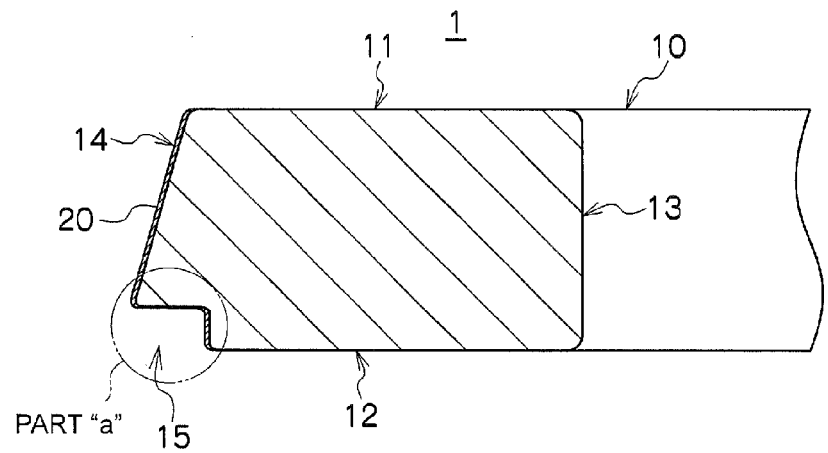
FIGS. 1A to 1C are schematic cross-sectional configuration diagrams illustrating each piston ring of the present invention.
Figure 1B:
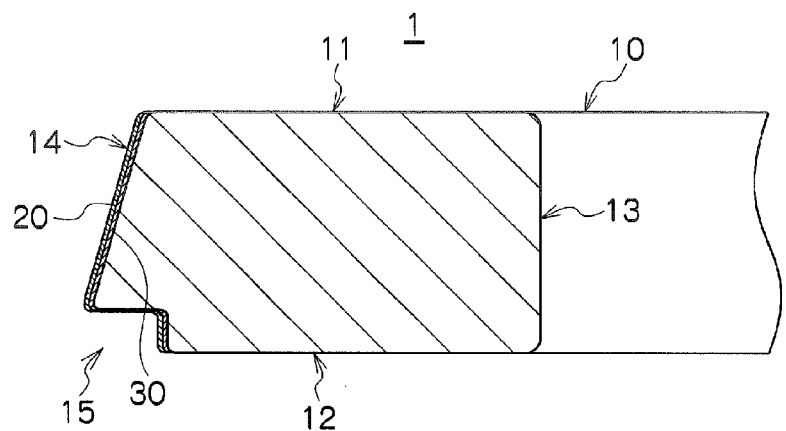
Figure 1C:
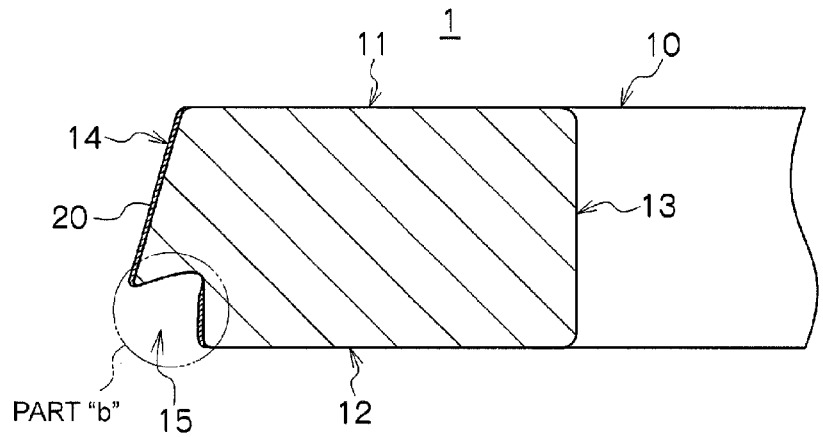
Figure 2A:
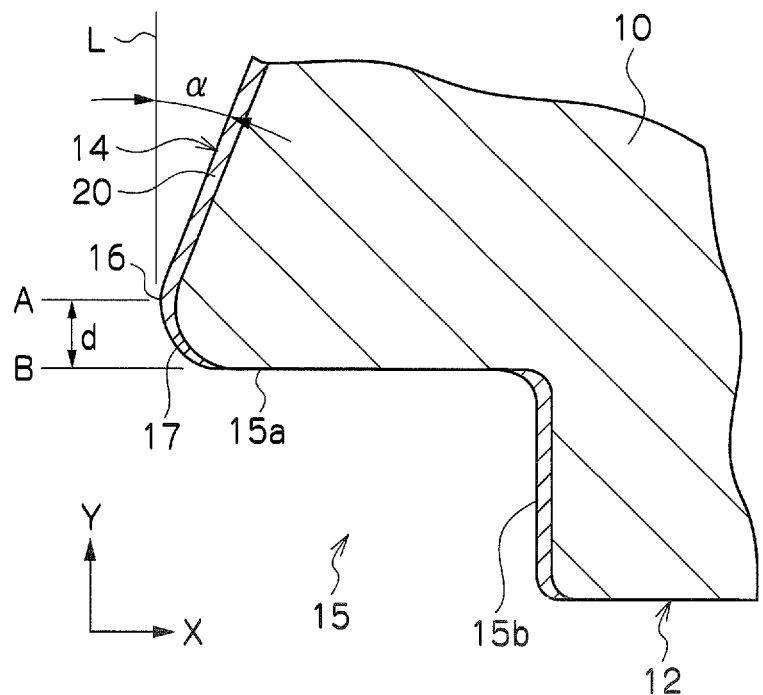
FIGS. 2A and 2B are enlarged cross-sectional diagrams of a portion "a" and a portion "b" of piston ring illustrated in FIGS. 1A and 1C.
Figure 2B:
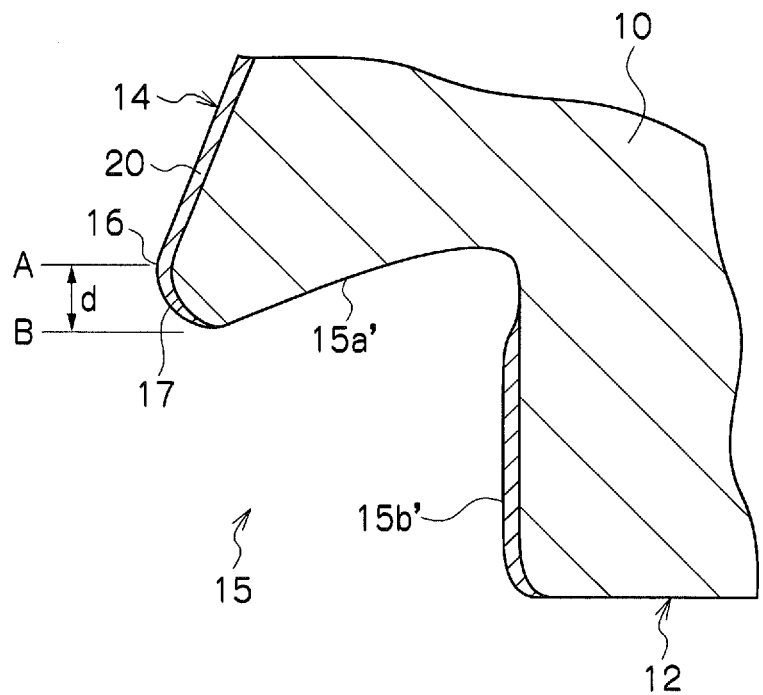

In the following, a piston ring of the present invention will be described in detail with reference to the Drawings. The present invention is not limited to the following explanation and description of the Drawings as long as the invention falls within the technical scope.

[Piston Ring]

As illustrated in FIGS. 1A to 4, piston rings 1, 2 are formed such that the outer peripheral surfaces shape of piston rings 1, 2 are tapered face, and that the radial cross-sectional shape thereof is a rectangular ring, a scraper ring or a Napier ring. Piston rings 1, 2 are used as a second compression ring. Piston rings 1, 2 have piston ring bases 10, 40, and hard films 20 provided at least on outer peripheral sliding surfaces 14, 44 of piston ring bases 10, 40. Piston rings 1, 2 are sliding members which are fitted in piston ring grooves formed on the outer peripheral surfaces of the pistons (not illustrated), and move up and down while sliding on the inner peripheral surfaces of cylinder liners (not illustrated) in accordance with the up-and-down movement of the pistons (in the same meaning as reciprocating movement). The shape of outer peripheral sliding surfaces 14, 44 of piston rings 1, 2 have one of the above-mentioned tapered forms in order to fulfill a function as a second compression ring.

In rings 1, 2, base film 30 may be formed between piston ring bases 10, 40 and hard film 20 as needed.

In the present application, the terms "upper end" and "lower end" mean both ends of outer peripheral sliding surfaces 14, 44 of piston rings 1, 2 or piston ring bases 10, 40 in the axial direction (or outer peripheral sliding surfaces 14, 44 in the width direction). Specifically, the upper end part of outer peripheral sliding surfaces 14, 44 when FIGS. 1A to 1C or the like is viewed in a planar view is referred to as "upper end", and the lower end part thereof is referred to as "lower end". Further, "top surface" and "bottom surface" mean both surfaces of piston rings 1, 2 or piston ring bases 10, 40 in the axial direction. Specifically, the upper side surface when FIG. 1 or the like is viewed in a planar view is referred to as "top surface", and the lower side surface "bottom surface", "outer peripheral surface" and "inner peripheral surface" mean both surfaces of piston rings 1, 2 or piston ring bases 10, 40 in the radial direction. Specifically, the left side surface when FIGS. 1A to 1C or the like is viewed in a planar view is referred to as "outer peripheral surface", and the right side surface "inner peripheral surface".

(Piston Ring Base)

The outer peripheral surface shape of piston ring bases 10, 40 is a tapered face, and the piston ring bases 10, 40 are formed such that the radial cross-sectional shape thereof is a rectangular ring, a scraper ring or a Napier ring. The cross-sectional shape thereof is, as illustrated in FIG. 1 (A) and FIG. 1 (B), formed to be flush with top surfaces 11, 41 and bottom surfaces 12, 42 which are mutually in parallel. Inner peripheral surfaces 13, 43 are perpendicular to top surfaces 11, 41 and bottom surfaces 12, 42, respectively.

On the other hand, outer peripheral sliding surfaces 14, 44 are formed such that the surface expands gradually from top surfaces 11, 41 to bottom surfaces 12, 42 to form a tapered shape. Outer peripheral sliding surfaces 14, 44 formed in a tapered shape have an inclination in which the taper angle α with respect to the vertical line "L" is from 0.5° to 3° as illustrated in FIG. 2 (A) and FIG. 4.

In the scraper ring illustrated in FIG. 1 (A), FIG. 1 (B) and FIG. 2 (A), step-shaped cut portion 15 is formed at a lower portion of outer peripheral sliding surface 14. Step-shaped cut portion 15 is formed such that a lower end portion of outer peripheral sliding surface 14 is cut inside in the radial direction. Step-shaped cut portion 15 is composed of: horizontal surface 15a formed, at a predetermined position from bottom surface 12 of piston ring base 10 (for example, at a position 0.2 mm from the lower end), horizontally inside in the radial direction from outer peripheral sliding surface 14 of piston ring 1; and vertical surface 15b vertical to horizontal surface 15a at a position at a predetermined distance from outer edge end part 16 of piston ring 1 (for example, 0.5 mm from outer edge end part 16). Outer peripheral sliding surface 14 of piston ring 1 and horizontal surface 15a are smoothly connected by curved surface at the position of outer edge end part 16 of piston ring 1. Horizontal surface 15a and vertical surface 15b are also connected by curved surface. Since such a step-shaped cut portion 15 is formed at the lower portion of outer peripheral sliding surface 14, outer edge end part 16 positioned outermost of outer peripheral sliding surface 14 in the radial direction (also referred to as "nose part") is a boundary portion between outer peripheral sliding surface 14 and step-shaped cut portion 15.

In FIG. 2 (A), mark "X" represents the radial direction of piston ring 1,2, and mark "Y" represents the axial direction of piston ring 1,2.

The shapes of the lower portion of outer peripheral sliding surface 14 are the same in the Napier ring illustrated in FIG. 1 (C) and FIG. 2 (B). As illustrated in FIG. 2 (B), step-shaped cut portion 15 is composed of curved surface 15a' and vertical surface 15b' formed such that it is scooped from outer peripheral sliding surface 14 of piston ring 1 to inside in the radial direction. Outer peripheral sliding surface 14 of piston ring 1 and curved surface 15a' are connected smoothly by curved surface at the position of outer edge end part 16 of piston ring 1.

In the scraper ring as illustrated in FIG. 2 (A) or the Napier ring as illustrated in FIG. 2 (B), outer edge end part 16 which connects outer peripheral sliding surface 14 and horizontal surface 15a or curved surface 15a' is provided with hard film 20. Hard film 20 is formed, as illustrated in FIG. 2 as "d" (hereinafter referred to as "length d"), in a range of from 0.01 mm to 0.30 mm in the axial direction of piston ring base 10. When length "d" is smaller than 0.01 mm, as piston ring 1 slides on the inner peripheral surface of the cylinder liner, a crack is likely to be generated on hard film 20. On the other hand, when length "d" is larger than 0.30 mm, the scraping function is reduced. "Length d" in piston ring 1 on which hard film 20 has been formed is, as illustrated in FIG. 2 (A) and FIG. 2 (B), the length in the axial direction "Y" between coordinate position "A" of outer edge end part 16 and imaginary line "B" in which a curved surface, whose diameter gradually shrinks inside (the diameter is decreased) from outer edge end part 16 to the lower end in the axial direction "Y," touches the lower end surface parallel to ring underside 12 (FIG. 2 (A)) or the lower end part (FIG. 2 (B)).

Next, the composition of piston ring bases 10, 40 will be described. Piston ring bases 10, 40 are made of carbon steel material, low-alloy steel material, spring steel material, or other steel material having steel material characteristics equal to them. Examples of the carbon steel material include hard wire material, in particular, SWRH62A or SWRH62B as per JIS, or other carbon steel materials having steel material characteristics equal to them. Examples of the low-alloy steel include oil-tempered wire for valve spring, in particular, SWOSC-V as per JIS standard or other low-alloy steel having steel material characteristics equal to this. Examples of the spring steel wire material include, in particular, SUP9, SUP10 or SUP11 as per JIS standard, or other spring steel material having steel material characteristics equal to them. In the present invention, carbon steel material, low-alloy steel material or spring steel material containing C: from 0.2 mass % to 1.0 mass % can be preferably used.

C (carbon) is not only needed to obtain hardness and strength but an important element for improving the wear resistance by forming minute hard carbide (for example, hard chromium carbide). When the C content is in the above range, not only needed mechanical property is obtained but also excessive generation of the hard carbide can be inhibited. When the C content is less than 0.2 mass %, it becomes difficult to obtain needed mechanical properties such as hardness or strength. On the other hand, when the C content is more than 1.0 mass %, the hard carbide appears and aggressiveness against the inner peripheral surface of the cylinder liner is increased.

In the above case, Cr is preferably contained in a range of from 0.5 mass % to 1.1 mass %.

Cr (chromium) is an element which forms a solid solution with piston ring bases 10, 40 to improve heat resistance or corrosion resistance, and part of Cr forms a carbide to improve seize resistance. When Cr content is in the above range of from 0.5 mass % to 1.1 mass %, fatigue of piston ring bases 10, 40 by heat is effectively prevented and at the same time, adherence of hard film 20 is improved. When Cr content is less than 0.5 mass %, heat fatigue resistance deteriorates, which is disadvantageous. On the other hand, when the Cr content is more than 1.1 mass %, hard carbide appears and aggressiveness against the inner peripheral surface of cylinder liners 1, 2 increases; and the cost increases, which are problematic.

Piston ring bases 10, 40 are carbon steel material containing as the balance iron and inevitable impurities, and may contain other elements such as Si or Mn according to a desired to applications.

Si (silicon) is added as a deoxidizer, and is effective in preventing fatigue by heat in the same manner as in the case of Cr. When Si is contained, the Si content is preferably in a range of from 0.1 mass % to 1.6 mass %. By containing Si in such range, the above-mentioned effect can be effectively obtained. When the Si content is less than 0.1 mass %, the effect of preventing fatigue can not be effectively obtained. On the other hand, when the Si content is more than 1.6 mass %, processing property during forming a ring may be deteriorated and at the same time, toughness may be reduced.

Mn (manganese) is added as a deoxidizer in the same manner as in the case of Si. Mn is an element effective in increasing the strength. When Mn is added, the content thereof is preferably from 0.2 mass % to 1.0 mass %. Even when the Mn content is less than 0.2 mass %, although Mn has an effect as a deoxidizer, it becomes difficult to improve the strength. On the other hand, when the Mn content is more than 1.0 mass %, processing property during forming a ring may be deteriorated.

Other than Si or Mn, Mo (molybdenum), Ni (nickel), V (vanadium) or the like may be added as needed to improve wear resistance, corrosion resistance, heat resistance or the like.

These piston ring bases 10, 40 are, before base film 30 or hard film 20 is formed on the surface thereof, cleaned by "ion bombardment" in which arc discharge is generated between a metal target which is used for forming base film 30 or hard film 20 and a cathode, and the surface of piston ring bases 10, 40 is irradiated with ionized metal ion. By this, a passivation film such as an oxidized film or a hydroxylated film present on the surface of piston ring bases 10, 40 is destroyed and the piston ring bases are cleaned.

Such piston ring bases 10, 40 are formed such that the hardness thereof is in a range of a Vickers hardness of from Hv 350 to Hv 550. When the piston ring bases are formed such that the Vickers hardness is in this range, piston ring bases 10, 40 having large thermal load or pressure load can favorably fulfill its function as a second compression ring. Piston ring bases 10, 40 having a Vickers hardness in the above-mentioned range are obtained, as described in a section of below-described manufacturing method, by performing a cleaning treatment for forming hard film 20 on piston ring bases 10, 40 with good adherence. Namely, Piston ring bases 10, 40 is obtained by performing a cleaning treatment in which the surface is irradiated with ionized metal ion which is a metal target, while maintaining the temperature such that the hardness of piston ring bases 10, 40 is not decreased. Therefore, the hardness of piston ring bases 10, 40 used in the present invention is not decreased even by a cleaning treatment before hard film 20 (and also base film 3 as needed) is formed. As the result, piston rings 1, 2 in which hard film 20 is formed on piston ring bases 10, 40 with good adherence are obtained.

(Base Film)

Base film 30 is provided as needed as illustrated in FIG. 1 (B) and FIG. 3 (B). Base film 30 is a film which is provided in order to prevent peel-off by increasing adherence of hard film 20 against piston ring bases 10, 40, and is provided at least on outer peripheral sliding surfaces 14, 44 of piston ring bases 10, 40. Although, as illustrated in FIG. 1 (B), typically, the base film is provided only on outer peripheral sliding surfaces 14, 44, it may be provided on three surfaces, outer peripheral sliding surfaces 14, 44 as a base film of hard film 20, as well as top surfaces 11, 41 and bottom surfaces 12, 42, and it may also be formed on the entire perimeter, outer peripheral sliding surfaces 14, 44, top surfaces 11, 41, bottom surfaces 12, 42 and inner peripheral surfaces 13, 43.

As base film 30, Cr film or Cr—B film can be preferably applied. Base film 30 can be formed in a variety of forming methods, and is preferably formed in a dry method such as a sputtering method, a vacuum evaporation technique, or an ion plating method. The thickness of base film 30 is not particularly restricted and preferably about from 0.5 μm to 2.0 μm.

(Hard Film)

Hard film 20 is an ion plating coat which is formed by an ion plating method, and examples thereof include a Cr—N film or Cr—B—N film. As illustrated in FIG. 1 (A) to FIG. 1 (C), the hard film is provided at least on outer peripheral sliding surface 14 of piston ring base 10. The hard film may be provided on outer peripheral sliding surface 14 of piston ring base 10 as well as top surface 11, bottom surface 12 and inner peripheral surface 13.

FIG. 1 (B) illustrates a piston ring which has an outer peripheral surface shape tapered face, whose radial cross-sectional shape is scraper ring and on which base film 30 is formed. When hard film 20 is provided as illustrated in FIG. 1 (B), hard film 20 is provided on base film 30. In this case, base film 30 is provided at least on outer peripheral sliding surface 14 of piston ring base 1, and hard film 20 is also provided on outer peripheral sliding surface 14 of base film 30. By laminating base film 30 and hard film 20 on outer peripheral sliding surface 14, adherence can be further improved, and peel-off of hard film 20 under high surface pressure can be inhibited as much as possible. Such piston ring 1 can attain high wear resistance and high scuffing resistance. When base film 30 is provided on the entire perimeter of piston ring base 10, hard film 20 may also be provided on the entire perimeter. Also in this case, hard film 20 may be provided at least on outer peripheral sliding surface 14, and the film can be optionally provided on top surface 11, bottom surface 12 and inner peripheral surface 13 as needed.

In this piston ring 1, hard film 20 is formed such that the film thickness thereof is from 5 μm to 30 μm. When the film thickness of hard film 20 is less than 5 μm, the wear resistance is not sufficient. On the other hand, when the film thickness of hard film 20 is larger than 30 μm, a crack is likely be generated on hard film 20, which is disadvantageous.

Hard film 20 is formed such that the porosity is from 0.5% to 1.5%. Assuming that the porosity is less than 0.5%, toughness is reduced and the film becomes fragile and crack is likely to be generated. On the other hand, when the porosity is larger than 1.5%, the hardness of the film is decreased and wear resistance is deteriorated, as well as, it becomes difficult to obtain appropriate surface roughness during a processing.

The Vickers hardness of thus provided hard film 20 is from Hv 800 to Hv 2300.

Preferably, in hard film 20, the film thickness thereof is from 7 μm to 20 μm, the porosity thereof is from 0.7% to 1.3%, and the Vickers hardness thereof is from Hv 1000 to Hv 2000.

The present invention can be applied, as mentioned above, to a scraper ring in which the outer peripheral surface shape is tapered face, as well as to a Napier ring as illustrated in FIG. 1 (C).

Figure 3A:
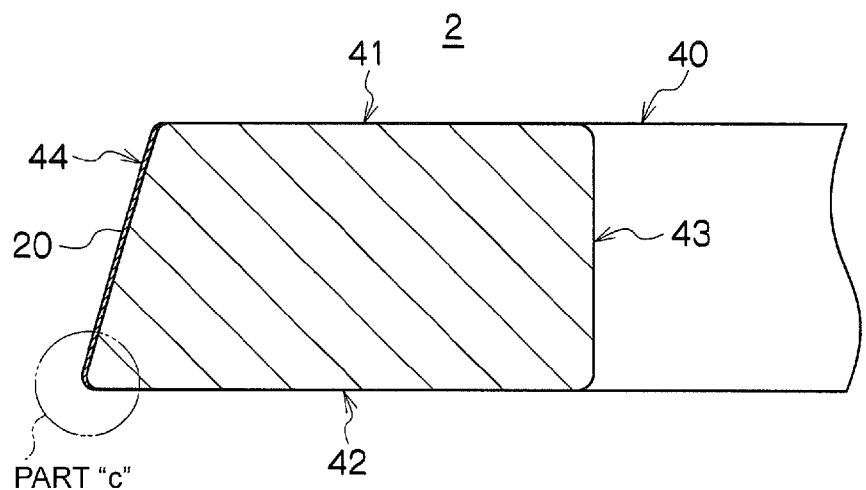
FIGS. 3A and 3B are schematic cross-sectional configuration diagrams illustrating other examples of a piston ring according to the present invention.
Figure 3B:
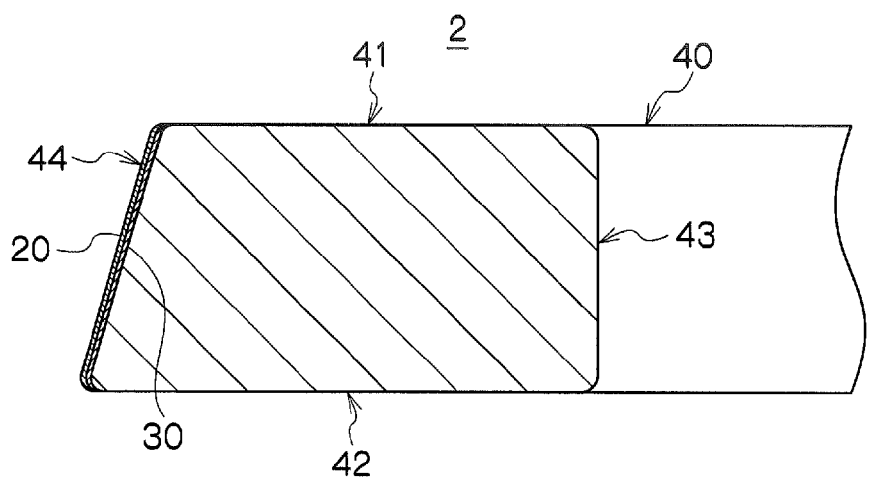
Figure 4:
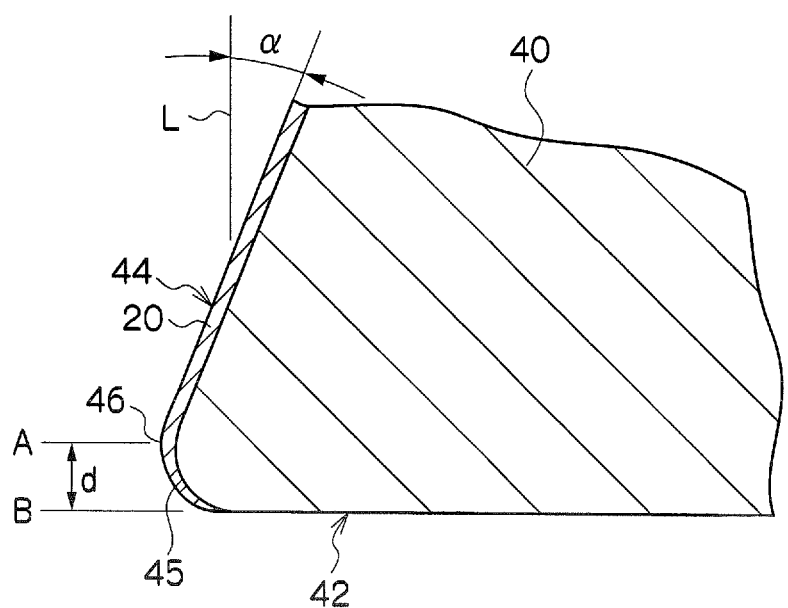
FIG. 4 is an enlarged cross-sectional diagram of a portion "c" of a piston ring illustrated in FIG. 3.

As above, piston ring 1 in which step-shaped cut portion 15 is formed on the lower end part of outer peripheral sliding surface 14 of piston ring base 10 has been described. As illustrated in FIGS. 3A and 3B and FIG. 4, the present invention can also be applied to piston ring 2 in which a step-shaped cut portion is not provided, namely applied to a rectangular ring.

Piston rings 2 illustrated in FIGS. 3A and 3B and FIG. 4 include piston ring base 40, and hard film 20 provided at least on outer peripheral sliding surface 44 of piston ring base 40. Since this piston ring 2 differs from piston ring 1 illustrated in FIGS. 1A to 1C and FIGS. 2A and 2B only in the shape of the outer edge end part of piston ring base 40, and is the same in other constitutions of piston ring base 40, and hard film 20. Therefore, only the outside shape of piston ring base 40 will be herein described in detail.

Piston ring base 40 as illustrated in FIG. 3 (A) is formed such that the cross-sectional shape thereof is flush with top surface 41 and bottom surface 42 being parallel to each other. Inner peripheral surface 43 is formed so as to be perpendicular to top surface 41 and bottom surface 42.

On the other hand, outer peripheral sliding surface 44 is formed such that the surface expands outward gradually from top surface 41 to bottom surface 42 and has a tapered shape. Piston ring base 40 also has an inclination in which the taper angle α with respect to the vertical line "L" as illustrated in FIG. 4 is from 0.5° to 3°.

In addition, as illustrated in FIG. 4, the lower end part of outer peripheral sliding surface 44 is connected from bottom surface 42 which constitutes piston ring base 40 to outer edge end part 46 of piston ring 2. By this, in piston ring 2 after hard film 20 has been formed, outer edge end part 46 positioned on the outermost in the radial direction on outer peripheral sliding surface 44 is a boundary portion between outer peripheral sliding surface 44 and bottom surface 42. The connecting portion (nose part) between outer peripheral sliding surface 44 and bottom surface 42 is provided with hard film 20 as illustrated in FIG. 4, and formed in a length "d" of from 0.01 mm to 0.30 mm in the axial direction of piston ring 2. The term herein "length d" in piston ring 2 on which hard film 20 has been formed is, as illustrated in FIG. 4, the length in the axial direction "Y" between coordinate position "A" of outer edge end part 46 and imaginary line "B" in which a curved surface whose diameter gradually shrinks inside (the diameter is decreased) from outer edge end part 46 to the lower end in the axial direction "Y" touches the lower end surface or the lower end part parallel to ring underside 42.

Also in piston ring 2, as illustrated in FIG. 3 (B), base film 30 may be formed on piston ring base 40, and hard film 20 may be formed on base film 30.

(Hard Carbon Film)

Figure 5A:
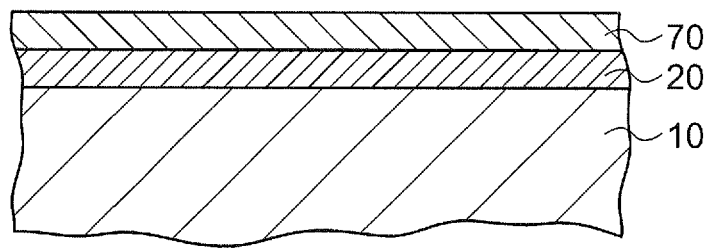
FIGS. 5A and 5B are schematic cross-sectional diagrams illustrating an example in which, on a hard film, a hard carbon film (diamond-like carbon) is formed.
Figure 5B:
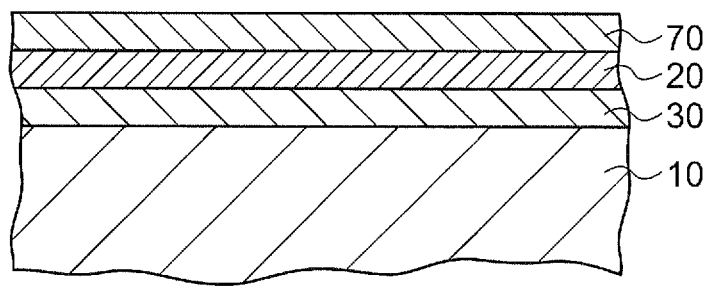

As illustrated in FIG. 5 (A) and FIG. 5 (B), hard carbon film 70 can be optionally provided on hard film 20. Example of FIG. 5 (A) is an embodiment in which hard film 20 is formed on piston ring base 10 (same in piston ring base 40) and hard carbon film 70 is further formed on hard film 20. Example of FIG. 5 (B) is an embodiment in which base film 30 is formed on piston ring bases 10, 40, and hard film 20 is formed on base film 30, and hard carbon film 70 is further formed on hard film 20.

Hard carbon film 70 is also referred to as "diamond-like carbon film", and means an amorphous carbon film. By forming hard carbon film 70 on hard film 20, hard carbon film 70 functions so as to reduce the initial friction of piston rings 1, 2. Such a function is based on that hard carbon film 70 has low coefficient of friction against the inner peripheral surface of cylinder liner which is the mating member of piston rings 1, 2, and has a favorable initial running-in property against the mating member. In particular, the outer edge end parts (nose part) 16, 46 of piston rings 1, 2 preferably has a smooth surface having a surface roughness Ra (arithmetic mean roughness Ra as per JIS B0601-1994) after hard carbon film 70 has been provided of 0.1 μm or less, and preferably 0.05 μm or less. By providing such smooth hard carbon film 70, the initial friction of the inner peripheral surface of the cylinder liner which slides on outer edge end part (nose part) 16, 46 of piston rings 1, 2 can be further improved.

Hard carbon film 70 can preferably include, other than carbon, one or more components among silicon, oxygen, hydrogen, nitrogen and argon. Hard carbon film 70 is preferably formed in the same ion plating method as the above hard film 20, and may also be formed by a variety of forming methods such as a sputtering method and a CVD method. The thickness of hard carbon film 70 is not particularly restricted, and is, for example, about from 0.5 μm to 10 μm.

[Manufacturing Method of Piston Ring]

Figure 6:
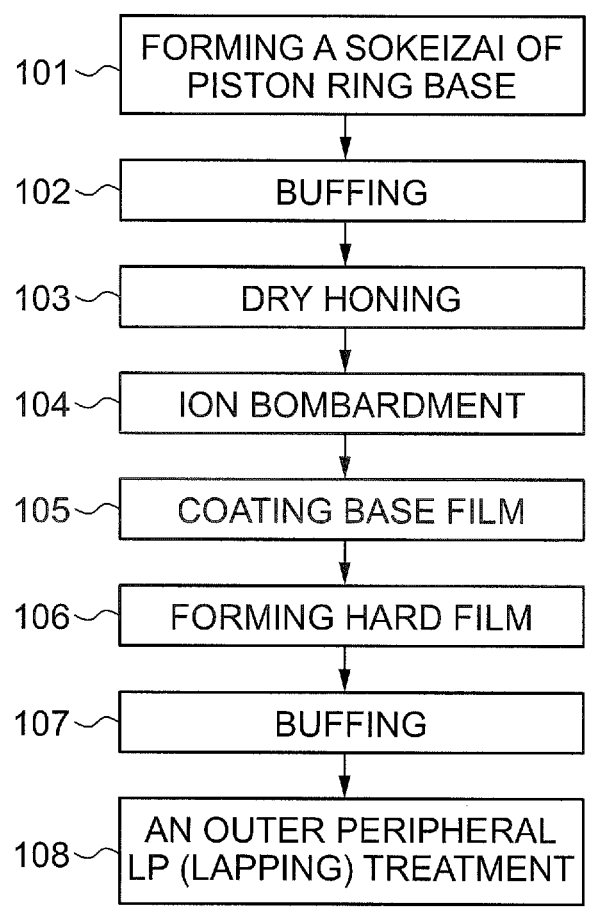
FIG. 6 is a flowchart illustrating one example of a manufacturing process of a piston ring according to the present invention.

Piston ring 1, 2 of the present invention is manufactured by way of a process illustrated in, for example, FIG. 6.

First, a sokeizai (stuff to principle forms) of piston ring bases 10, 40 is formed by processing the above-mentioned carbon steel material (process 101). Next, as a process before forming hard film 20, piston ring bases 10, 40 formed in a desired size are subjected to buffing (process 102). Next, dry honing is performed in which a grinding and cleaning material is blown to piston ring bases 10, 40 with a compressed air to remove scale or the like (process 103). By way of such processes, piston ring bases 10, 40 are formed such that the surface roughness is 5 μm in ten points mean roughness Rz in accordance with JIS B0601-1994.

Next, a process in which prepared piston ring bases 10, 40 are fixed on a film forming jig; a process in which piston ring bases 10, 40 are placed in a chamber of ion plating device and the chamber is vacuumed; and a preheating process in which, while rotating or revolving a film forming jig on which piston ring bases 10, 40 are fixed, preheating is conducted as a whole for degassing are performed in the mentioned order. After being subjected to the preheating process, an inert gas such as argon gas is introduced, and the surface of piston ring bases 10, 40 is cleaned by an ion bombardment process (process 104).

The ion bombardment process is a method in which arc discharge is generated between a metal target which is used for forming base film 30 or hard film 20 and a cathode to ionize a metal and the surface of piston ring bases 10, 40 is irradiated with the ionized metal ion. By the ion bombardment process, a passivation film such as an oxidized film or a hydroxylated film present on the surface of piston ring bases 10, 40 is destroyed and the piston ring bases 10, 40 are cleaned.

Piston ring bases 10, 40 are cleaned while maintaining the temperature at which decrease in hardness does not occur in order to prevent softening by heating due to the ion bombardment process.

The maintenance of the temperature at which decrease in hardness does not occur is performed by, for example, sandwiching a furnace cooling process in the ion bombardment process, or appropriately adjusting arc current or bias voltage. In a method of maintaining the temperature at which decrease in hardness does not occur, temperature rise of piston ring bases 10, 40 may be prevented by utilizing cooling water.

Figure 7:
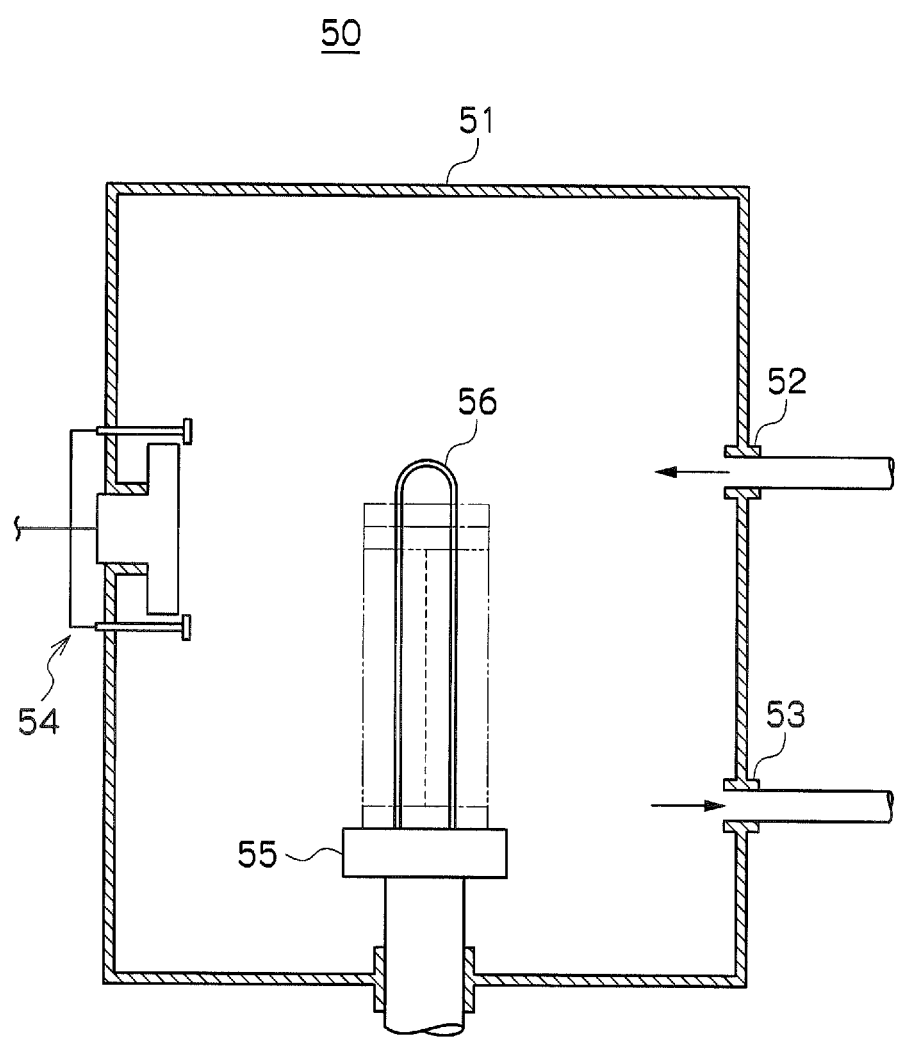
FIG. 7 is a longitudinal section schematically illustrating the structure of an ion plating device for forming a hard film.

FIG. 7 is a schematic view illustrating the structure of ion plating device 50 which cools piston ring bases 10, 40 by utilizing cooling water. Ion plating device 50 comprises: chamber 51 which accommodates therein piston ring bases 10, 40; arc generating part 54 in which high frequency plasma arc is generated in chamber 51; piston ring bases 10, 40; turntable 55 which rotates horizontally at a desired speed. Chamber 51 is provided with inlet 52 by which a desired gas is introduced into the inside thereof, and outlet 53 by which the gas introduced into the inside of chamber 51 is discharged. Further, in ion plating device 50, circulation pathway 56 by which cooling water is circulated inside placed piston ring bases 10, 40 is provided. Circulation pathway 56 is arranged in an appropriate state such that piston ring bases 10, 40 can be effectively cooled.

As conditions of such ion bombardment, argon gas is introduced, and, for example, the arc current is set to 75-150 A and the bias voltage is set to −1000 to −600 V.

In such ion bombardment process, since piston ring bases 10, 40 can be cleaned while maintaining the temperature at which decrease in the hardness of piston ring bases 10, 40 occur, hard film 20 having good wear resistance can be formed with good adherence on piston ring bases 10, 40 in which decrease in hardness has not occurred.

After completing the ion bombardment process, a processing process in which base film 30 or hard film 20 is coated on the surface of piston ring bases 10, 40 is performed.

In cases where base film 30 is formed under hard film 20, base film 30 is formed at least on outer peripheral sliding surfaces 14, 44 of piston ring bases 10, 40 (process 105). Base film 30 may be formed on outer peripheral sliding surfaces 14, 44 of piston ring bases 10, 40, as well as, on top surfaces 11, 41, bottom surfaces 12, 42 and inner peripheral surfaces 13, 43 according to applications. In the forming process of base film 30, a Cr film or Cr—B film is formed by an ion plating method. As film forming conditions in the case of forming base film 30 by an ion plating method, for example, the atmosphere pressure of argon gas in the chamber is set to from 0.8-2.6 Pa, the arc current is set to from 100 A to 200 A and the bias voltage is set to from −10 to −30 V, and the ion plating method is performed for 15 minutes.

Next, hard film 20 of a Cr—N film or Cr—B—N film is formed at least on outer peripheral sliding surfaces 14, 44 (process 106). Hard film 20 is also formed by an ion plating method. As ion plating conditions for forming hard film 20, for example, the pressure in argon gas in the chamber is set to from 1.3-4.0 Pa, the arc current is set to from 100 A to 200 A and the bias voltage is set to 0 V to −30 V, and the ion plating method is performed for about 120 minutes.

By way of such processes, hard film 20 is formed on piston ring bases 10, 40.

After completing the forming process of hard film 20, the surface is then subjected to buffing (process 107), and finally, subjected to an outer peripheral LP (lapping) treatment (process 108) in order to "guess" outer peripheral sliding surfaces 14, 44 of piston rings 1, 2, thereby completing piston rings 1, 2. The term "LP" (lapping) treatment means a treatment in which the outer peripheral surface of a ring is ground by abrasive grain.

As above, piston rings 1, 2 of the present invention relate to a second compression ring of a piston ring for an internal combustion engine whose outer peripheral surface shape is formed in any of tapered face/rectangular ring, tapered face/scraper ring and tapered face/Napier ring. Since the piston rings do not have a nitriding layer which is formed by a conventional nitriding treatment, thermal load is small, variation in size of piston rings 1, 2 is reduced, and yield thereof improves thereby reducing the cost, as well as, labor and cost needed for processing or heat treatment is considerably reduced. Since hard film 20 is directly provided at least on outer peripheral sliding surfaces 14, 44 of piston ring bases 10, 40, piston rings 1, 2 have superior wear resistance.

In particular, since the Vickers hardness of piston ring bases 10, 40 composed of carbon steel material or low-alloy steel is in a range of Hv 350 to Hv 550 and a hard film having a Vickers hardness of from Hv 800 to Hv 2300 is directly provided on such piston ring bases 10, 40, in piston rings 1, 2, decrease in strength which occurs during conventional nitriding treatment process does not occur, strength is maintained, and piston rings 1, 2 have superior wear resistance and low cost. Even when such a piston ring according to the present invention is used for a diesel engine which has large thermal load and pressure load, the strength or hardness of piston ring bases 14, 44 are favorably maintained, thereby effectively preventing a crack in a hard film.

EXAMPLES

In the following, the present invention will be further described by way of Examples and Comparative Examples.

Example 1

In order to form piston ring base 10, a sokeizai of second compression ring shaped piston ring base 10 was processed by a hard steel wire composed of C: 0.63 mass %, Si: 0.25 mass %, Mn: 0.75 mass %, P: 0.01 mass %, S: 0.01 mass %, the balance: iron and inevitable impurities (process 101). The sokeizai of piston ring base 10 was subjected to buffing (process 102), then to a dry honing by a grinding and cleaning material (process 103) to thereby form piston ring base 10. The shape of outer peripheral sliding surface 14 of piston ring 1 was tapered face, and the radial cross-sectional shape was scraper ring (see FIG. 1 (B)).

Next, piston ring base 10 was placed in the chamber of the ion plating device, and then, a process in which the chamber was vacuumed, and a preheating process in which preheating was conducted as a whole for degassing while rotating or revolving a film forming jig on which piston ring base 10 was fixed, were performed. After being subjected to the preheating process, argon gas was introduced, and the surface of piston ring base 10 was cleaned by an ion bombardment (process 104).

The ion bombardment process (process 104 in FIG. 6) was performed while maintaining the temperature at which decrease in hardness of piston ring base 10 did not occur. In this case, the arc current was set to 100 A and the bias voltage was set to −600 V.

Next, the pressure of argon gas atmosphere in the chamber was set to 1.3 Pa, the arc current was set to 150 A and the bias voltage was set to −25 V, and base film 30 having a thickness of 1.0 μm composed of a Cr film was formed over 15 minutes (process 105).

Then, the pressure of nitrogen gas atmosphere in the chamber was set to 2.8 Pa, the arc current was set to 150 A, and the bias voltage was set to −25 V, and hard film 20 having a thickness 11.5 μm composed of a Cr—N film was formed over 120 minutes (process 106). The Cr—N film is an ion plating film composed of Cr, CrN and $Cr_2N$.

In addition, buffing was performed (process 107), and finally, an outer peripheral LP treatment was performed (process 108) to thereby complete piston ring 1 (see FIG. 1 (B)).

In the obtained piston ring 1, the Vickers hardness of piston ring base 10 was Hv 450, and the Vickers hardness was hardly changed. The Vickers hardness of piston ring base 10 before hard film 20 was formed was Hv 454. Hard film 20 formed at outer edge end part (also referred to as "nose part") 16 of piston ring 1 was formed in a length "d" of 0.1 mm in the axial direction of piston ring 1. The film thickness of hard film 20 was 11.5 μm, the porosity was 0.9%, and further, the Vickers hardness was Hv 1395. The results thereof are listed in Table 1.

Example 2

In Example 2, in the same manner as in Example 1, a sokeizai of piston ring base 10 was processed by a hard steel wire composed of C: 0.63 mass %, Si: 0.25 mass %, Mn: 0.75 mass %, P: 0.01 mass %, S: 0.01 mass %, the balance: iron and inevitable impurities. The sokeizai was subjected to buffing (process 102), to a dry honing (process 103), and to an ion bombardment (process 104) to thereby form piston ring base 10.

Next, without forming a base film, hard film 20 was formed directly on piston ring base 10 in the same conditions as in Example 1 (process 106), and by way of buffing (process 107) and an outer peripheral LP treatment (process 108), piston ring 1 was obtained (see FIG. 1 (A)).

The Vickers hardness of piston ring base 10 of obtained piston ring 1 was Hv 446. The Vickers hardness of piston ring base 10 before hard film 20 was formed was Hv 450. Hard film 20 formed at outer edge end part (nose part) 16 of piston ring 1 was formed in a length "d" of 0.1 mm in the axial direction of piston ring 1. The film thickness of hard film 20 was 10.5 μm, the porosity was 1.0%, and further, the Vickers hardness was Hv 1373. The results thereof are listed in Table 1.

Example 3

In Example 3, as hard film 20, a Cr—B—N film was formed. Piston ring 1 was formed in the same manner as in Example 1 except for changing conditions such that the Cr—B—N film was formed. The Cr—B—N film was obtained by forming a solid solution by a Cr—N film and B.

The Vickers hardness of piston ring base 10 of obtained piston ring 1 was Hv 439. The Vickers hardness of piston ring base 10 before hard film 20 was formed was Hv 445. Hard film 20 formed at outer edge end part (nose part) 16 of piston ring 1 was formed in a length "d" of 0.1 mm in the axial direction of piston ring 1. The film thickness of hard film 20 was 11.0 μm, the porosity was 1.3%, and further, the Vickers hardness was Hv 1863. The results thereof are listed in Table 1.

Example 4

In Example 4, piston ring 1 was formed in the same manner as in Example 1 except that the thickness of hard film 20 was changed to 18.0 μm and further, the axial length "d" was changed to 0.20 mm. The characteristics of obtained piston ring 1 are listed on Table 1.

Example 5

In Example 5, piston ring 1 was formed in the same manner as in Example 1 except that the thickness of hard film 20 was changed to 29.0 μm. The characteristics of obtained piston ring 1 are listed on Table 1.

Example 6

In Example 6, piston ring 1 was formed in the same manner as in Example 1 except that hard carbon film 70 was further formed on hard film 20. With respect to hard carbon film 70, after performing an LP treatment (process 108) in Example 1, a hard carbon film (diamond-like carbon film) having a thickness of 2.8 μm was formed by a sputtering method using a carbon target and argon as an introduced gas. The characteristics of obtained piston ring 1 are listed on Table 1.

Example 7

In Example 7, as piston ring base 10, a silicon chrome steel wire composed of Cr: 0.65 mass %, C: 0.55 mass %, Si: 1.4 mass %, Mn: 0.65 mass %, P: 0,01 mass %, S: 0.01 mass %, the balance: iron and inevitable impurities was used. The other conditions are the same as in Example 1.

The Vickers hardness of piston ring base 10 of obtained piston ring 1 was Hv 495. The Vickers hardness of piston ring base 10 before hard film 20 was formed was Hv 501. Hard film 20 formed at outer edge end part (nose part) 16 of piston ring 1 was formed in a length "d" of 0.09 mm in the axial direction of piston ring 1. The film thickness of hard film 20 was 10.9 μm, the porosity was 1.0%, and further, the Vickers hardness was Hv 1375. The results thereof are listed in Table 1.

Example 8

In Example 8, piston ring 1 was formed in the same manner as in Example 7 except that the thickness of hard film 20 was changed to 20.5 μm, and further, the axial length "d" was changed to 0.22 mm. The characteristics of obtained piston ring 1 are listed on Table 1.

Example 9

In Example 9, piston ring 1 was formed in the same manner as in Example 7 except that hard carbon film 70 was further formed on hard film 20. With respect to hard carbon film 70, after performing an LP treatment (process 108) in Example 1, a hard carbon film (diamond-like carbon film) having a thickness of 2.8 μm was formed by a sputtering method using a carbon target and argon as an introduced gas. The characteristics of obtained piston ring 1 are listed on Table 1.

Example 10

In Example 10, as piston ring base 10, a spring steel material composed of C: 0.56 mass %, Si: 0,25 mass %, Mn: 0.8 mass %, P: 0.01 mass %, Cr: 0.8 mass %, the balance: Fe and inevitable impurities was used. The other conditions are the same as in Example 1.

The Vickers hardness of piston ring base 10 of obtained piston ring 1 was Hv 470. The Vickers hardness of piston ring base 10 before hard film 20 was formed was Hv 475. Hard film 20 formed at outer edge end part (nose part) 16 of piston ring 1 was formed in a length "d" of 0.10 mm in the axial direction of piston ring 1. The film thickness of hard film 20 was 12.0 μm, the porosity was 1.3%, and further, the Vickers hardness was Hv 1370. The results thereof are listed in Table 1.

Example 11

In Example 11, piston ring 1 was formed in the same manner as in Example 10 except that the thickness of hard film 20 was changed to 16.0 μm, and further, the axial length"d" was changed to 0.20 mm, The characteristics of obtained piston ring 1 are listed on Table 1.

Example 12

In Example 12, piston ring 1 was formed in the same manner as in Example 10 except that hard carbon film 70 was further formed on hard film 20. With respect to hard carbon film 70, after performing an LP treatment (process 108) in Example 1, a hard carbon film (diamond-like carbon film) having a thickness of 2.8 μm was formed by a sputtering method using a carbon target and argon as an introduced gas. The characteristics of obtained piston ring 1 are listed on Table 1.

Comparative Example 1

Piston ring of Comparative Example 1 was formed in the same manner as in Example 1 except that conditions were changed. The piston ring in the Comparative Example 1 was formed such that the film thickness of the hard film was 3.4 μm and smaller than 5 μm.

Comparative Example 2

The piston ring in the Comparative Example 2 was formed such that the film thickness of the hard film was 31.5 μm, which was larger than 30 μm.

Comparative Example 3

Piston ring of Comparative Example 3 was formed in the same manner as in Example 1 except that conditions were changed. The piston ring in the Comparative Example 3 was formed such that the porosity of the hard film was 0.2%, which was smaller than the lower limit of the present invention 0.5%

Comparative Example 4

The piston ring of Comparative Example 4 was formed such that the porosity of the hard film was 1.9%, which is larger than the upper limit of the present invention 1.5%.

Comparative Example 5

In Comparative Example 5, hard film 20 formed on outer edge end part 16 of outer peripheral sliding surface 14 in piston ring base 10 used in Example 1 was formed in a length "d" of 0.005 mm in the axial direction, which is smaller than the lower limit of the present invention 0.01 mm.

Comparative Example 6

In Comparative Example 6, hard film 20 formed on outer edge end part 16 of outer peripheral sliding surface 14 in piston ring base 10 used in Example 1 was formed in a length "d" of 0.35 mm in the axial direction, which is larger than the upper limit of the present invention 0.30 mm.

Comparative Example 7

In Comparative Example 7, a cleaning process was performed without cooling the piston ring base in an ion bombardment process. The piston ring of Comparative Example 7 was formed by way of the same process as in Example 1 except that a cooling process was absent in the ion bombardment process. The Vickers hardness of the piston ring base of the obtained piston ring was Hv 344, which was considerably lower than the Vickers hardness of piston ring base 10 before hard film 20 was formed Hv 453.

Comparative Example 8

Piston ring of Comparative Example 8 was formed in the same manner as in Example 7 except that conditions were changed. The piston ring in the Comparative Example 8 was formed such that the film thickness of the hard film was 4.1 which is smaller than 5 μm.

Comparative Example 9

The piston ring in the Comparative Example 9 was formed such that the film thickness of the hard film was 31.2 μm, which was larger than 30 μm.

Comparative Example 10

Piston ring of Comparative Example 10 was formed in the same manner as in Example 7 except that conditions were changed. The piston ring in the Comparative Example 10 was formed such that the porosity of the hard film was 0.3%, which was smaller than the lower limit of the present invention 0.5%.

Comparative Example 11

The piston ring of Comparative Example 11 was formed such that the porosity of the hard film was 2.1%, which was larger than the upper limit of the present invention 1.5%.

Comparative Example 12

In Comparative Example 12, hard film 20 formed on outer edge end part 16 of outer peripheral sliding surface 14 in piston ring base 10 used in Example 7 was formed in a length "d" of 0.005 mm in the axial direction, which is smaller than the lower limit of the present invention 0.01 mm.

Comparative Example 13

In Comparative Example 13, hard film 20 formed on outer edge end part 16 of outer peripheral sliding surface 14 in piston ring base 10 used in Example 7 was formed in a length "d" of 0.33 mm in the axial direction, which is larger than the upper limit of the present invention 0.30 mm.

Comparative Example 14

In Comparative Example 14, a cleaning process was performed without cooling the piston ring base in an ion bombardment process. The piston ring of Comparative Example 14 was formed by way of the same process as in Example 1 except that a cooling process was absent in the ion bombardment process. The Vickers hardness of the piston ring base of the obtained piston ring was Hv 320, which was considerably lower than the Vickers hardness of piston ring base 10 before hard film 20 was formed Hv 490.

Comparative Example 15

Piston ring of Comparative Example 15 was formed in the same manner as in Example 10 except that conditions were changed. The piston ring in the Comparative Example 15 was formed such that the film thickness of the hard film was 3.9 μm, which was smaller than 5 μm.

Comparative Example 16

The piston ring in the Comparative Example 16 was formed such that the film thickness of the hard film was 32.0 μm, which was larger than 30 μm.

Comparative Example 17

Piston ring of Comparative Example 17 was formed in the same manner as in Example 10 except that conditions were changed. The piston ring in the Comparative Example 17 was formed such that the porosity of the hard film was 0.3%, which was smaller than the lower limit of the present invention 0.5%.

Comparative Example 18

The piston ring of Comparative Example 18 was formed such that the porosity of the hard film was 1.8%, which was larger than the upper limit of the present invention 1.5%, Comparative Example 19

In Comparative Example 19, hard film 20 formed on outer edge end part 16 of outer peripheral sliding surface 14 in piston ring base 10 used in Example 10 was formed in a length "d" of 0.005 mm in the axial direction, which is smaller than the lower limit of the present invention 0.01 mm.

Comparative Example 20

In Comparative Example 20, hard film 20 formed on outer edge end part 16 of outer peripheral sliding surface 14 in piston ring base 10 used in Example 10 was formed in a length "d" of 0.35 mm in the axial direction, which is larger than the upper limit of the present invention 0.30 mm.

Comparative Example 21

In Comparative Example 21, a cleaning process was performed without cooling the piston ring base in an ion bombardment process. The piston ring of Comparative Example 21 was formed by way of the same process as in Example 1 except that a cooling process was absent in the ion bombardment process. The Vickers hardness of the piston ring base of the obtained piston ring was Hv 335, which was considerably lower than the Vickers hardness of piston ring base 10 before hard film 20 was formed Hv 475.

[Wear Test]

Figure 8:
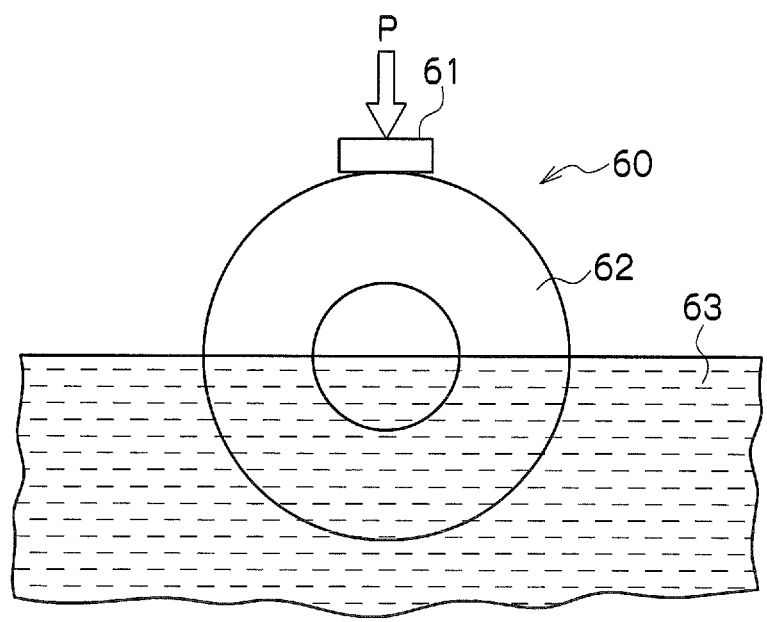
FIG. 8 is an explanatory drawing of an Amsler wear testing machine used for measurement.

In a wear test, Amsler wear testing machine 60 as illustrated in FIG. 8 was used, measurement sample 61 (7 mm×8 mm×5 mm) obtained in the same conditions as in the piston ring obtained in the above-mentioned Examples 1 to 12 and Comparative Examples 1 to 21 was used as a fixing piece, those having a doughnut shape (external diameter 40 mm, internal diameter 16 mm, thickness 10 mm) was used as mating member 62 (rotating piece), and measurement sample 61 and mating member 62 were in contact with each other and load P was loaded. Conditions of determination of the coefficient of friction using measurement sample 61 was performed under conditions of lubricating oil 63: KURISEF H8 (corresponding to #1 SPINDLE OIL), oil temperature: 80° C., circumferential speed: 1 msec (478 rpm), load: 1471.5 N, testing time: 7 hours, and using boron cast iron as mating member 62. Mating member 62 composed of boron cast iron was subjected to a grinding processing into a predetermined shape, and then to a successive surface grinding by varying the fineness of the abrasive wheel, thereby being adjusted to finally 1 to 2 μm Rz (ten point mean roughness; in accordance with JIS B0601 (1994)).

Regarding wear indices listed in Table 2, the wear amount of each measurement sample corresponding to each of Examples 1 to 12 was compared as a relative ratio with respect to the wear amount of the measurement sample of Comparative Example 1, to be set to a wear index. In the same manner, the measurement sample corresponding to each of Comparative Examples 2 to 21 was compared as a relative ratio with respect to the wear amount of the measurement sample of Comparative Example 1, to be represented by a wear index. Therefore, the smaller the wear index of each measurement sample is than 100, the smaller the wear amount is. The results thereof are listed in Table 2.

As is clear from the Table 2, each measurement sample formed corresponding to Examples 1 to 12, in which the film thickness of the hard film was from 5 μm to 30 μm, the porosity of the hard film was 0.5% to 1.5%, the length "d" was 0.01 mm to 0.30 mm, the Vickers hardness of the piston ring base was from Hv 350 to Hv 550, the Vickers hardness of the hard film 20 was from Hv 800 to Hv 2300, had a wear index of smaller than 100 and had superior wear resistance compared with the measurement sample corresponding to Comparative Example 1.

[Crack Test]

After hard film 20 was formed, a furnace cooling was performed for 150 minutes, and then, a sample was taken out from the furnace, and the outer appearance thereof was observed by visual inspection. Those in which a crack was generated were removed, and those in which a crack was not generated were subjected to a twist test.

Figure 9:
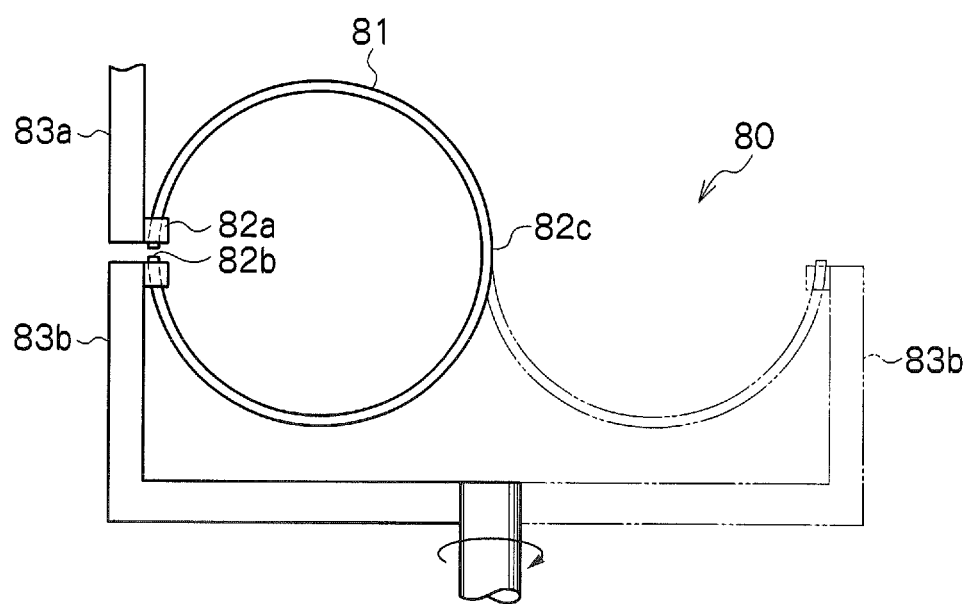
FIG. 9 is an explanatory drawing of a twist tester used for measurement.

The degree to which occurrence of a crack was inhibited (crack resistance) was evaluated by a twist test using twist tester 80 illustrated in FIG. 9. The twist test was a test in which the adherence of the hard film formed on piston ring 81 was evaluated. The measurement thereof was performed by a method in which opposing joint end parts 82*b* of joint 82*a* of piston ring 81 were gripped by grippers 83*a*, 83*b*, respectively, gripper 83*b* was rotated while fixing gripper 83*a* in the diameter direction of piston ring 81 around the opposite side of the joint 82*c* as illustrated in a chain line, and piston ring 81 was twisted in a predetermined twist angle. After twisting, the opposite side 82c of piston ring 81 was cut, and whether or not a hard film on the cut surface (fracture surface) peels off from the piston ring base was observed by visual inspection. The twist angle at this time was set to 90°.

The crack resistances as listed in Table 2 are the results of the above-mentioned twist test represented by the following evaluation criteria. "Rank 1" means that there was no occurrence of a crack when the piston ring was taken out from the furnace and there was no peel-off also in the twist test. "Rank 2" means that there was no occurrence when the piston ring was taken out from the furnace but a peel-off occurred in the twist test. "Rank 3" means that a crack occurred when the piston ring was taken out from the furnace. As shown in Table 2, in Comparative Examples 1, 2, 3, and 5, Comparative Examples 8, 9, 10, and 12, and Comparative Examples 15, 16, 17, and 19, the crack resistance was poor.

[Oil Consumption Test]

By piston rings obtained in Examples 4, 8, and 11 and Comparative Examples 6, 13, and 20 whose ring parent materials were the same, an oil consumption test was performed. In the oil consumption test, an actual in-line 4-cylinder gasoline engine having a displacement of 2.4 L and a cylinder inner diameter of 87 mm was used. The operation conditions of the engine were high load and 7,000 r.p.m. The amounts of oil consumed were measured by a continuous gravimetric method.

The measurement was performed by combining a first ring, a second ring and an oil ring. As the first ring, the one which was made of SWOSC-V material in which the width of the ring in the axial direction h1 was 1.2 mm, the width of the ring in the radial direction a1 was 2.9 mm, the outer peripheral surface shape was barrel face, and the outer peripheral surface was subjected to a PVD treatment was used. As the second ring, a piston ring obtained in Examples 4, 8, and 12 and Comparative Examples 6, 13, and 20 in which the width of the ring in the axial direction h1 was 1.0 mm, the width of the ring in the radial direction a1 was 2.5 mm was used. As the oil ring, a three-piece type oil ring was used. In the oil ring, the width of a spacer expander in the axial direction h1 was 2.0 mm, the width of the spacer expander in the radial direction a1 was 2.5 mm, the outer peripheral surface was subjected to a PVD treatment, the side rail was made of SWRH72A material as per JIS standard, and the spacer was made of SUS304 material.

The amount of oil consumed was confirmed and the results thereof are listed in Table 2. The value in each of Comparative Examples was larger than 1 compared with that in each of Examples, and it was found that the amount of oil consumed was likely to deteriorate.

[Hardness Measurement]

Hardness measurement was performed by a micro-Vickers hardness tester (manufactured by FUTURE-TECH CORP.; FM-ARS9000). With respect to piston ring 1 of Examples 1 to 12, the hardness of each of parent materials of piston ring base 10 was in a range of Hv 439 to Hv 495, and the Vickers hardness of each of hard films 20 was in a range of Hv 1370 to Hv 1863.

[Thickness Measurement]

Each of samples of hard film 20 was cut with a wet cutter and polished by embedding the sample in resin. The thickness was calculated by a cross-sectional observation. In Examples 1 to 12, the ring was formed such that the film thickness of hard film 20 was in a range of 5 μm to 30 μm.

[Component Measurement]

The component composition of hard film 20 was subjected to a quantitative determination by an electron probe microanalyzer (EPMA) (manufactured by JEOL Ltd., JXA-8800RL).

TABLE 1

| | | Piston Ring Base | | Hard Film | | | | DLC Film |
|---|---|---|---|---|---|---|---|---|
| | | Vickers Hardness Before Forming a Hard Film (Hv) | Vickers Hardness After Forming a Hard Film (Hv) | film thickness (μm) | porosity (%) | Length d (mm) | Vickers Hardness (Hv) | Vickers Hardness (Hv) |
| | Material | | | | | | | |
| Example 1 | Hard Steel Wire | 454 | 450 | 11.5 | 0.9 | 0.10 | 1395 | — |
| Example 2 | Hard Steel Wire | 450 | 446 | 10.5 | 1.0 | 0.10 | 1373 | — |
| Example 3 | Hard Steel Wire | 445 | 439 | 11.0 | 1.3 | 0.10 | 1863 | — |
| Example 4 | Hard Steel Wire | 445 | 442 | 18.0 | 1.0 | 0.20 | 1380 | — |
| Example 5 | Hard Steel Wire | 453 | 451 | 29.0 | 1.2 | 0.08 | 1376 | — |
| Example 6 | Hard Steel Wire | 454 | 449 | 22.0 | 0.8 | 0.10 | 1429 | 2085 |
| Example 7 | Silicon Chrome Steel Wire | 501 | 495 | 10.9 | 1.0 | 0.09 | 1375 | — |
| Example 8 | Silicon Chrome Steel Wire | 495 | 488 | 20.5 | 1.0 | 0.22 | 1382 | — |
| Example 9 | Silicon Chrome Steel Wire | 496 | 492 | 25.0 | 1.1 | 0.09 | 1370 | 2099 |
| Example 10 | Spring Steel Wire | 475 | 470 | 12.0 | 1.3 | 0.10 | 1370 | — |
| Example 11 | Spring Steel Wire | 476 | 467 | 16.0 | 1.0 | 0.20 | 1376 | — |

TABLE 1-continued

| | | Piston Ring Base | | Hard Film | | | | DLC Film |
| --- | --- | --- | --- | --- | --- | --- | --- | --- |
| | Material | Vickers Hardness Before Forming a Hard Film (Hv) | Vickers Hardness After Forming a Hard Film (Hv) | film thickness (μm) | porosity (%) | Length d (mm) | Vickers Hardness (Hv) | Vickers Hardness (Hv) |
| Example 12 | Spring Steel Wire | 472 | 465 | 21.0 | 1.0 | 0.09 | 1385 | 2070 |
| Comparative Example 1 | Hard Steel Wire | 443 | 436 | 3.4 | 1.2 | 0.10 | 1362 | — |
| Comparative Example 2 | Hard Steel Wire | 459 | 455 | 31.5 | 1.0 | 0.11 | 1388 | — |
| Comparative Example 3 | Hard Steel Wire | 455 | 449 | 12.0 | 0.2 | 0.09 | 1490 | — |
| Comparative Example 4 | Hard Steel Wire | 454 | 452 | 10.0 | 1.9 | 0.10 | 1284 | — |
| Comparative Example 5 | Hard Steel Wire | 456 | 452 | 9.9 | 0.9 | 0.005 | 1392 | — |
| Comparative Example 6 | Hard Steel Wire | 449 | 445 | 10.6 | 1.0 | 0.35 | 1374 | — |
| Comparative Example 7 | Hard Steel Wire | 453 | 344 | 11.2 | 1.1 | 0.10 | 1365 | — |
| Comparative Example 8 | Silicon Chrome Steel Wire | 503 | 497 | 4.1 | 0.8 | 0.11 | 1415 | — |
| Comparative Example 9 | Silicon Chrome Steel Wire | 490 | 485 | 31.2 | 1.1 | 0.09 | 1371 | — |
| Comparative Example 10 | Silicon Chrome Steel Wire | 497 | 491 | 15.0 | 0.3 | 0.12 | 1479 | — |
| Comparative Example 11 | Silicon Chrome Steel Wire | 493 | 489 | 16.0 | 2.1 | 0.10 | 1280 | — |
| Comparative Example 12 | Silicon Chrome Steel Wire | 495 | 487 | 20.0 | 1.1 | 0.005 | 1369 | — |
| Comparative Example 13 | Silicon Chrome Steel Wire | 496 | 490 | 18.0 | 1.2 | 0.33 | 1355 | — |
| Comparative Example 14 | Silicon Chrome Steel Wire | 490 | 320 | 15.0 | 1.0 | 0.09 | 1377 | — |
| Comparative Example 15 | Spring Steel Wire | 480 | 475 | 3.9 | 1.2 | 0.09 | 1350 | — |
| Comparative Example 16 | Spring Steel Wire | 470 | 462 | 32.0 | 1.1 | 0.10 | 1372 | — |
| Comparative Example 17 | Spring Steel Wire | 475 | 471 | 16.0 | 0.3 | 0.11 | 1472 | — |
| Comparative Example 18 | Spring Steel Wire | 469 | 462 | 18.0 | 1.8 | 0.10 | 1300 | — |
| Comparative Example 19 | Spring Steel Wire | 478 | 460 | 17.0 | 1.1 | 0.005 | 1367 | — |
| Comparative Example 20 | Spring Steel Wire | 476 | 472 | 15.5 | 0.9 | 0.35 | 1396 | — |
| Comparative Example 21 | Spring Steel Wire | 475 | 335 | 16.0 | 0.9 | 0.12 | 1409 | — |

TABLE 2

| | Wear Index | | | |
| --- | --- | --- | --- | --- |
| | Outer Peripheral Surface Wear Index | Top and Bottom Wear Index | Crack Resistance | The Rate of Oil Consumed |
| Example 1 | 95 | 95 | Rank1 | — |
| Example 2 | 97 | 96 | Rank1 | — |
| Example 3 | 85 | 99 | Rank1 | — |
| Example 4 | 96 | 98 | Rank1 | 1.00 |
| Example 5 | 96 | 94 | Rank1 | — |
| Example 6 | 89 | 95 | Rank1 | — |
| Example 7 | 96 | 77 | Rank1 | — |
| Example 8 | 96 | 80 | Rank1 | 1.00 |
| Example 9 | 88 | 78 | Rank1 | — |
| Example 10 | 97 | 87 | Rank1 | — |
| Example 11 | 96 | 88 | Rank1 | 1.00 |
| Example 12 | 89 | 89 | Rank1 | — |
| Comparative Example 1 | 100 | 100 | Rank2 | — |

TABLE 2-continued

| | Wear Index | | | |
|---|---|---|---|---|
| | Outer Peripheral Surface Wear Index | Top and Bottom Wear Index | Crack Resistance | The Rate of Oil Consumed |
| Comparative Example 2 | 95 | 93 | Rank3 | — |
| Comparative Example 3 | 91 | 95 | Rank3 | — |
| Comparative Example 4 | 107 | 94 | Rank1 | — |
| Comparative Example 5 | 95 | 94 | Rank3 | — |
| Comparative Example 6 | 97 | 96 | Rank1 | 1.51 |
| Comparative Example 7 | 99 | 136 | Rank1 | — |
| Comparative Example 8 | 94 | 76 | Rank2 | — |
| Comparative Example 9 | 97 | 81 | Rank3 | — |
| Comparative Example 10 | 92 | 78 | Rank3 | — |
| Comparative Example 11 | 108 | 79 | Rank1 | — |
| Comparative Example 12 | 98 | 80 | Rank3 | — |
| Comparative Example 13 | 99 | 79 | Rank1 | 1.34 |
| Comparative Example 14 | 96 | 145 | Rank1 | — |
| Comparative Example 15 | 100 | 85 | Rank2 | — |
| Comparative Example 16 | 97 | 90 | Rank3 | — |
| Comparative Example 17 | 92 | 86 | Rank3 | — |
| Comparative Example 18 | 106 | 90 | Rank1 | — |
| Comparative Example 19 | 98 | 91 | Rank3 | — |
| Comparative Example 20 | 94 | 86 | Rank1 | 1.39 |
| Comparative Example 21 | 94 | 140 | Rank1 | — |

DESCRIPTION OF THE REFERENCE NUMERALS 1, 2 Piston ring
10, 40 Piston ring base
11, 41 Top surface
12, 42 bottom surface
13, 43 Inner peripheral surface
14, 44 Outer peripheral sliding surface
15 Step-shaped cut portion
16, 46 Outer edge end part of piston ring (nose part)
17, 45 Outer edge end part of piston ring base
20 Hard film
30 Base film
50 Ion plating device
51 Chamber
52 Inlet
53 Outlet
54 Arc generating part
55 Turntable
56 circulation pathway
70 Hard carbon film
A Taper angle
L Vertical line
d Length (axial length between the outer edge end part and an imaginary line contacting with a lower end surface or a lower end part where a curved surface having a diameter that decreases gradually inward from the outer edge end part toward a lower end in the axial direction is parallel to a ring underside
A Coordinate position of the outer edge end part
B Imaginary line
X Radial direction
Y Axial direction

The invention claimed is:

1. A method of manufacturing a piston ring, the method comprising:
    forming a piston ring base by processing a low-alloy steel or carbon steel, each of the low-alloy steel and the carbon steel having a Vickers hardness of 350 Hv to 550 Hv;
    cleaning a surface of the piston ring base by irradiating the surface with a metal ion, which is an ionized metal target, while maintaining a temperature of the piston ring base at a temperature that does not cause the hardness of the piston ring base to decrease; and
    forming a hard film on an outer peripheral sliding surface of the piston ring base by an ion plating method, the hard film being composed of an ion plating coat having a film thickness of from 5 μm to 30 μm, a porosity of from 0.5% to 1.5%, and a Vickers hardness of from 800 Hv to 2300 Hv.

2. The method of manufacturing according to claim 1, wherein
    the ionized metal target is ionized by generating arc discharge between the ionized metal target and a cathode.

3. The method of manufacturing according to claim 1, wherein
    the temperature of the piston ring base is maintained by cooling the piston ring base.

4. The method of manufacturing according to claim 1, the method further comprising:
    forming a base film on the outer peripheral sliding surface of the piston ring base under the hard film.

5. The method of manufacturing according to claim 4, wherein
    the base film is a Cr film or Cr—B film.

6. The method of manufacturing according to claim 1, wherein
    a hard carbon film is formed on the hard film.

7. The method of manufacturing according to claim 1, wherein
    the piston ring is used as a second pressure ring for an internal combustion engine, the piston ring having an outer peripheral surface shape that is a tapered face, and a radial cross-sectional shape that is a shape selected from the group consisting of: a rectangular ring, a scraper ring, and a Napier ring.

8. The method of manufacturing according to claim 1, wherein
    the outer peripheral sliding surface is formed in a tapered shape that gradually expands outward from an upper end of the piston ring base toward a lower end of the piston ring base; and
    the piston ring base comprises:
        an outer edge end part of the tapered outer peripheral sliding surface;
        a lower end surface; and
    an imaginary line that contacts the lower end surface where a curved surface having a diameter that decreases gradually inward from the outer edge end part toward the lower end in the axial direction is parallel to a ring underside, and an axial length between the outer edge end part and the imaginary line is from 0.01 mm to 0.30 mm.

* * * * *